United States Patent [19]
Atkinson

[11] Patent Number: 5,335,299
[45] Date of Patent: Aug. 2, 1994

[54] VIDEO COMPRESSION ALGORITHM

[75] Inventor: William Atkinson, Los Gatos, Calif.

[73] Assignee: Apple Computer, Inc., Cupertino, Calif.

[21] Appl. No.: 694,660

[22] Filed: May 2, 1991

Related U.S. Application Data

[63] Continuation of Ser. No. 441,333, Nov. 22, 1989, Pat. No. 5,033,105, which is a continuation of Ser. No. 84,309, Aug. 11, 1987, abandoned.

[51] Int. Cl.$^5$ .............................................. G06K 9/36
[52] U.S. Cl. .................... 382/56; 358/261.1; 358/261.3; 382/47
[58] Field of Search ............... 382/56, 8, 48, 21, 22, 382/47; 358/133, 261.1, 261.2, 261.7, 261.4, 426

[56] References Cited

U.S. PATENT DOCUMENTS 5,033,105  7/1991  Atkinson ........................... 382/56

Primary Examiner—Joseph Mancuso
Attorney, Agent, or Firm—Blakely, Sokoloff, Taylor & Zafman

[57] ABSTRACT

A method for encoding compressed graphics video information and decoding such information. The method consists of enriching the video information in zeros through shifting and Exclusive ORing video image with itself. A number of methods are attempted in the shifting and Exclusive ORing process in order to determine the method which yields the optimum zero enriched image. The zero enriched image is then encoded and the encoded information stored. Upon retrieval, the information is decoded and an Exclusive OR and shifting process is done to obtain the original video information.

16 Claims, 8 Drawing Sheets

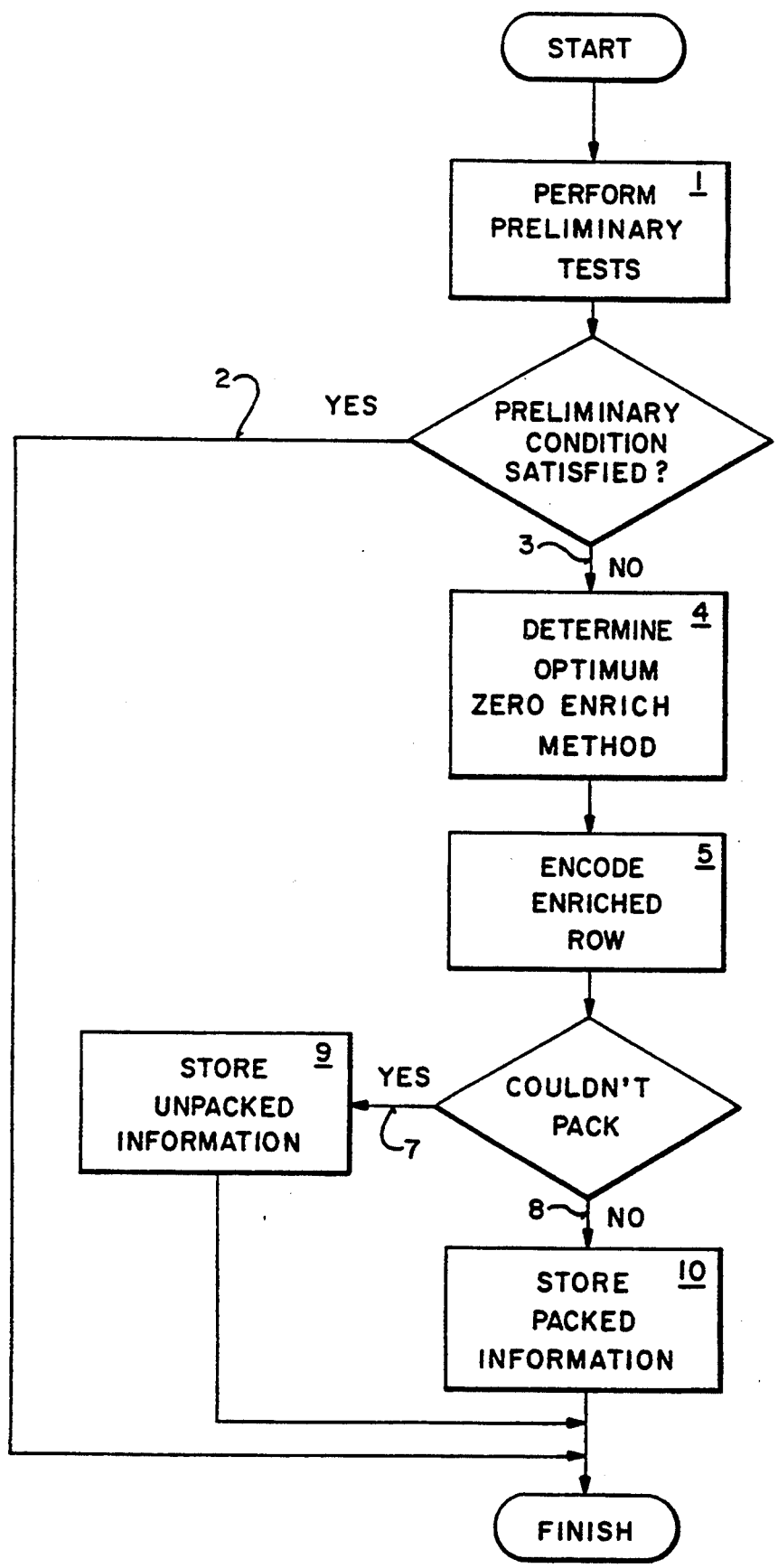
FIG_1

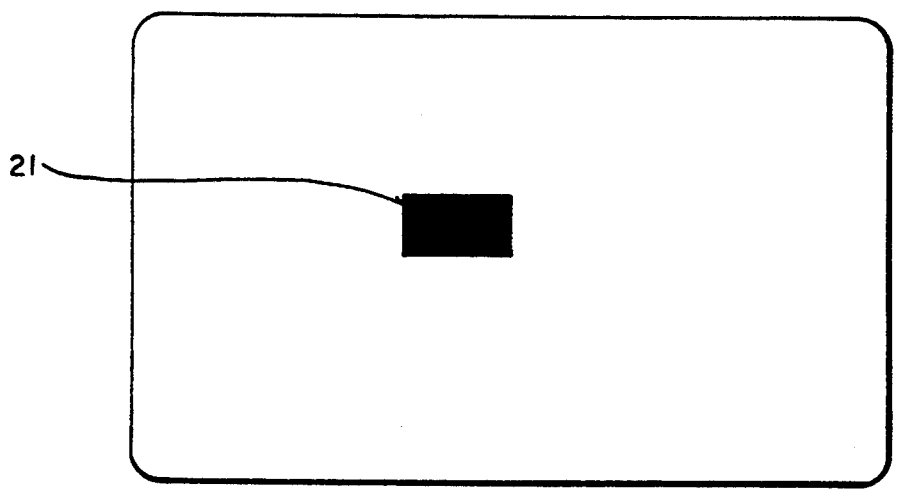
FIG_2A
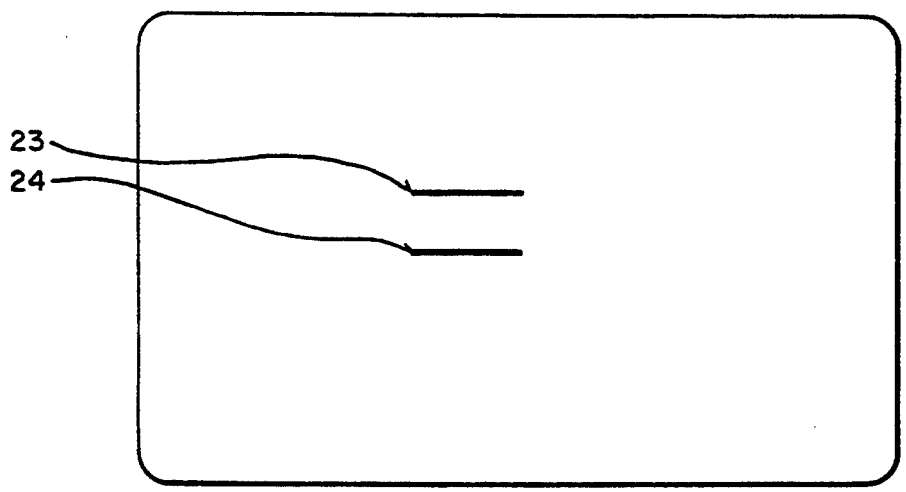
FIG_2B
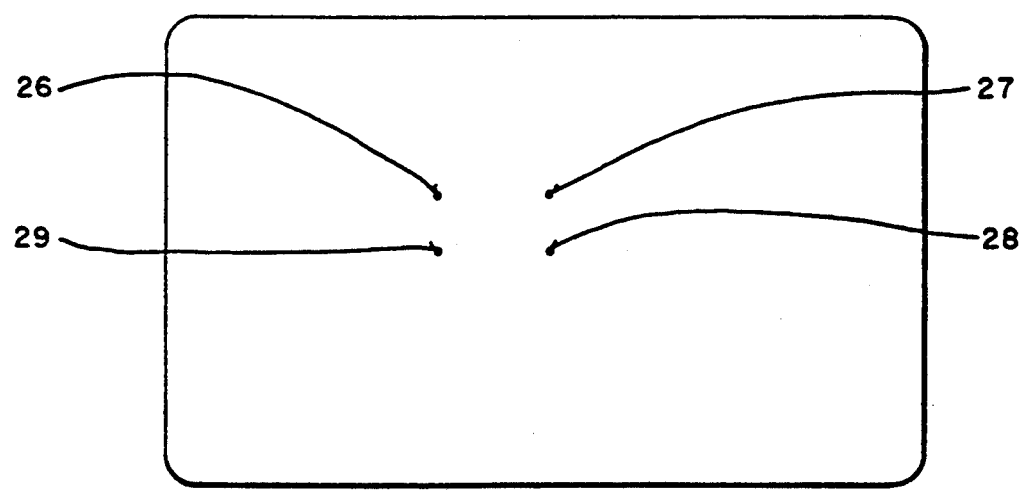
FIG_2C

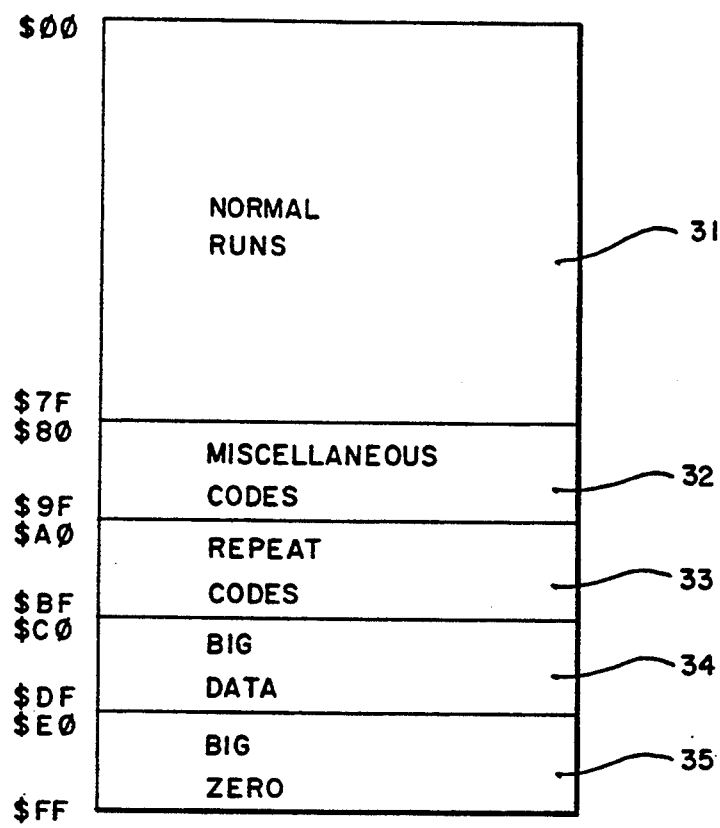

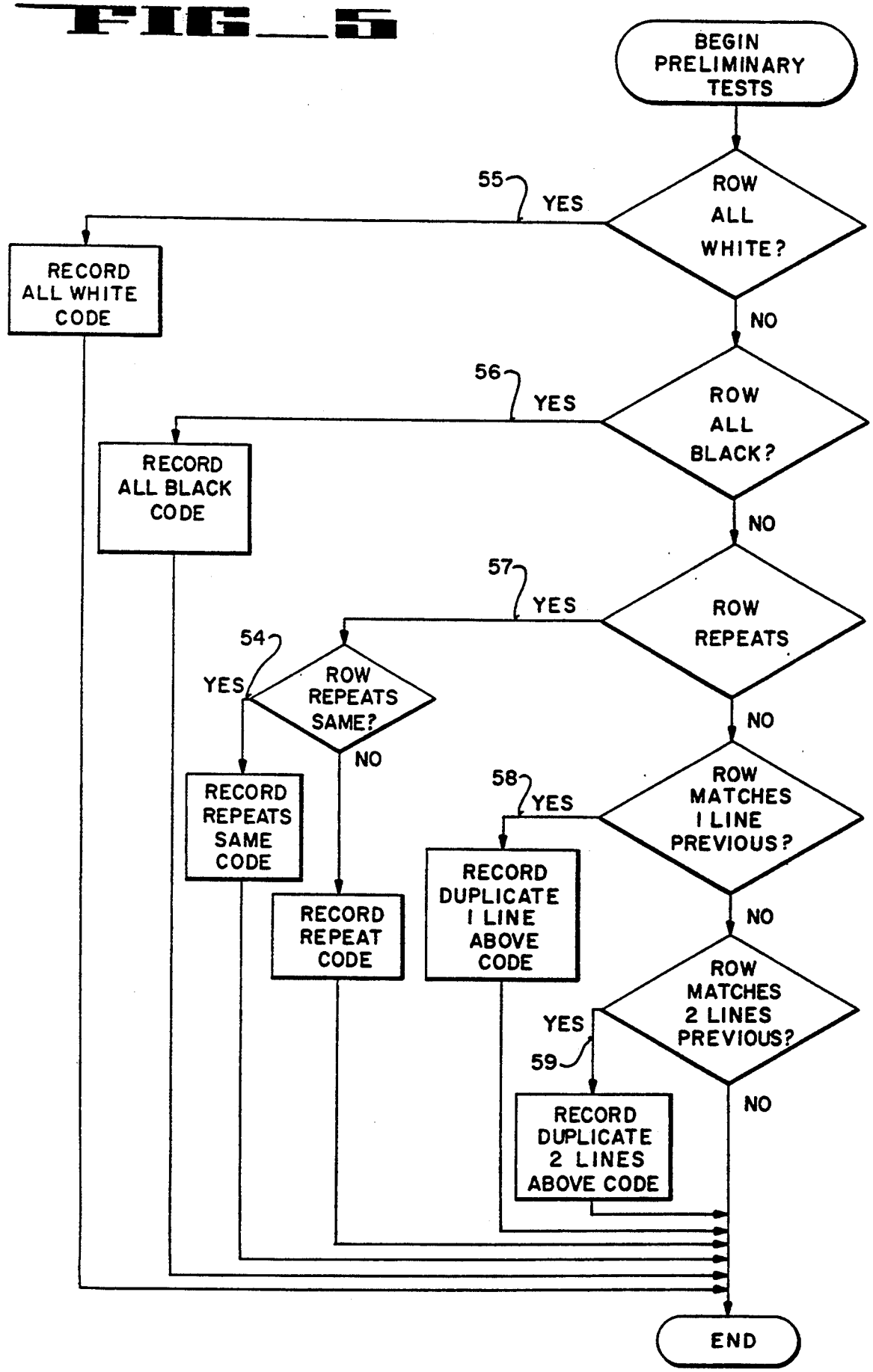

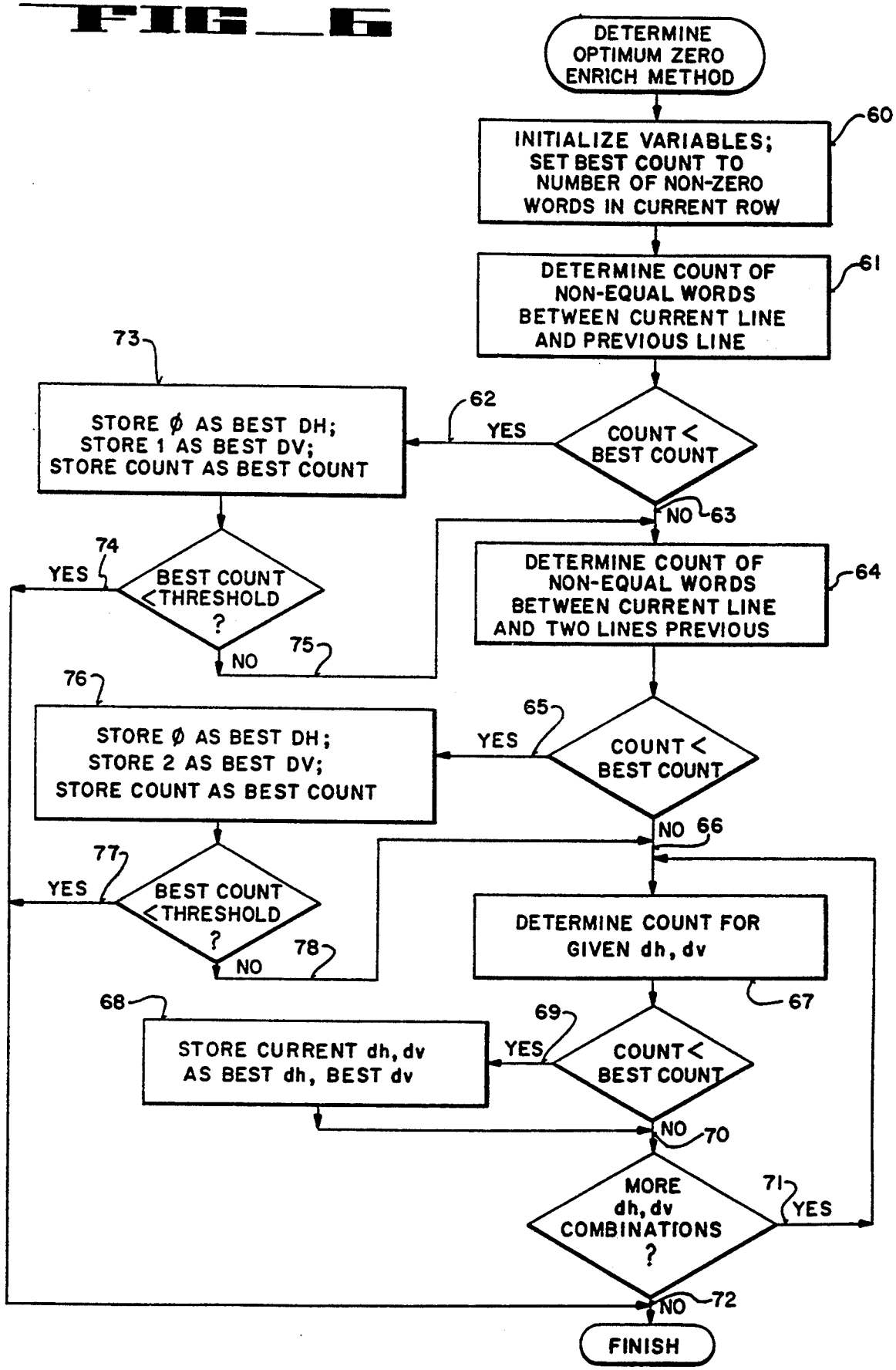

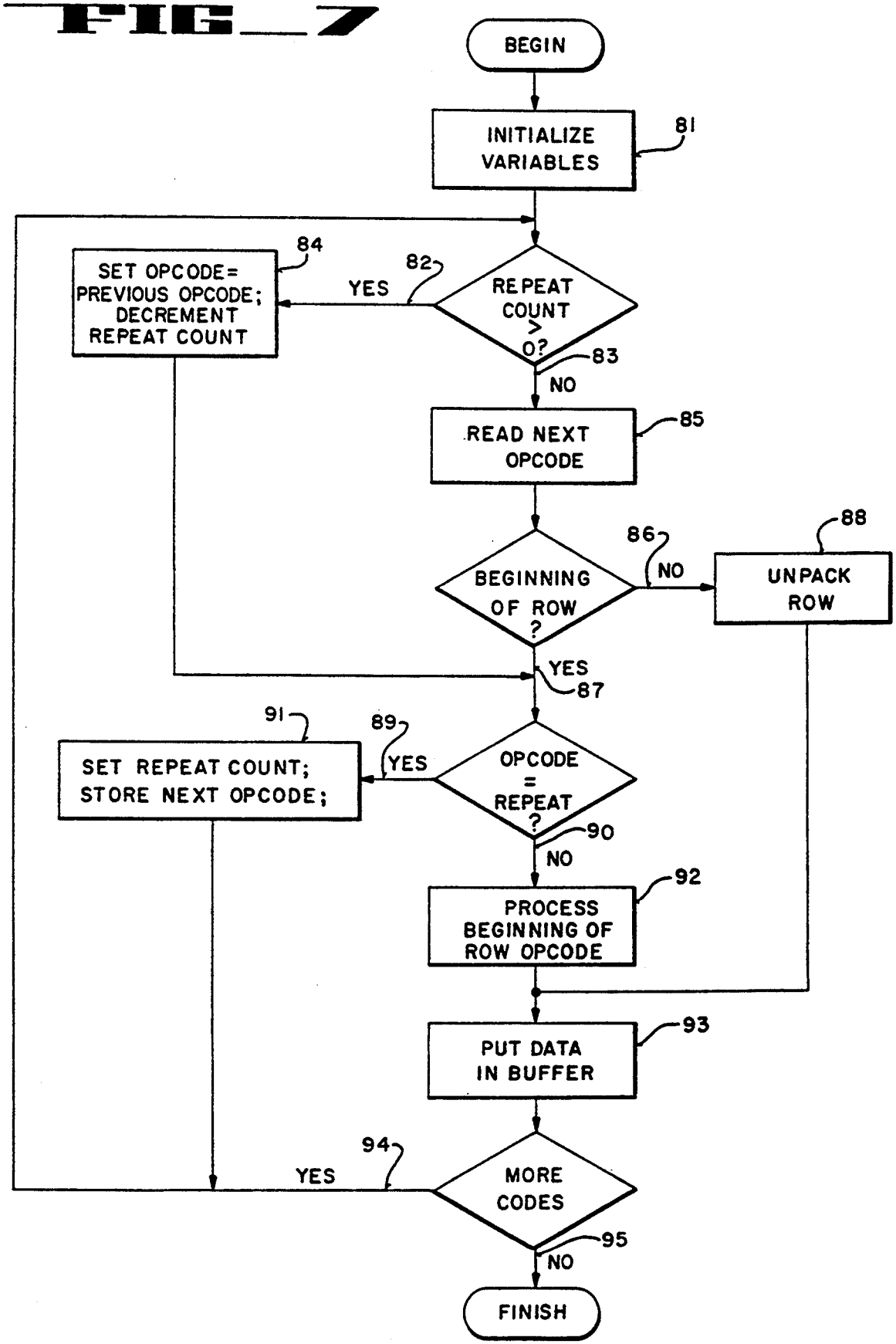

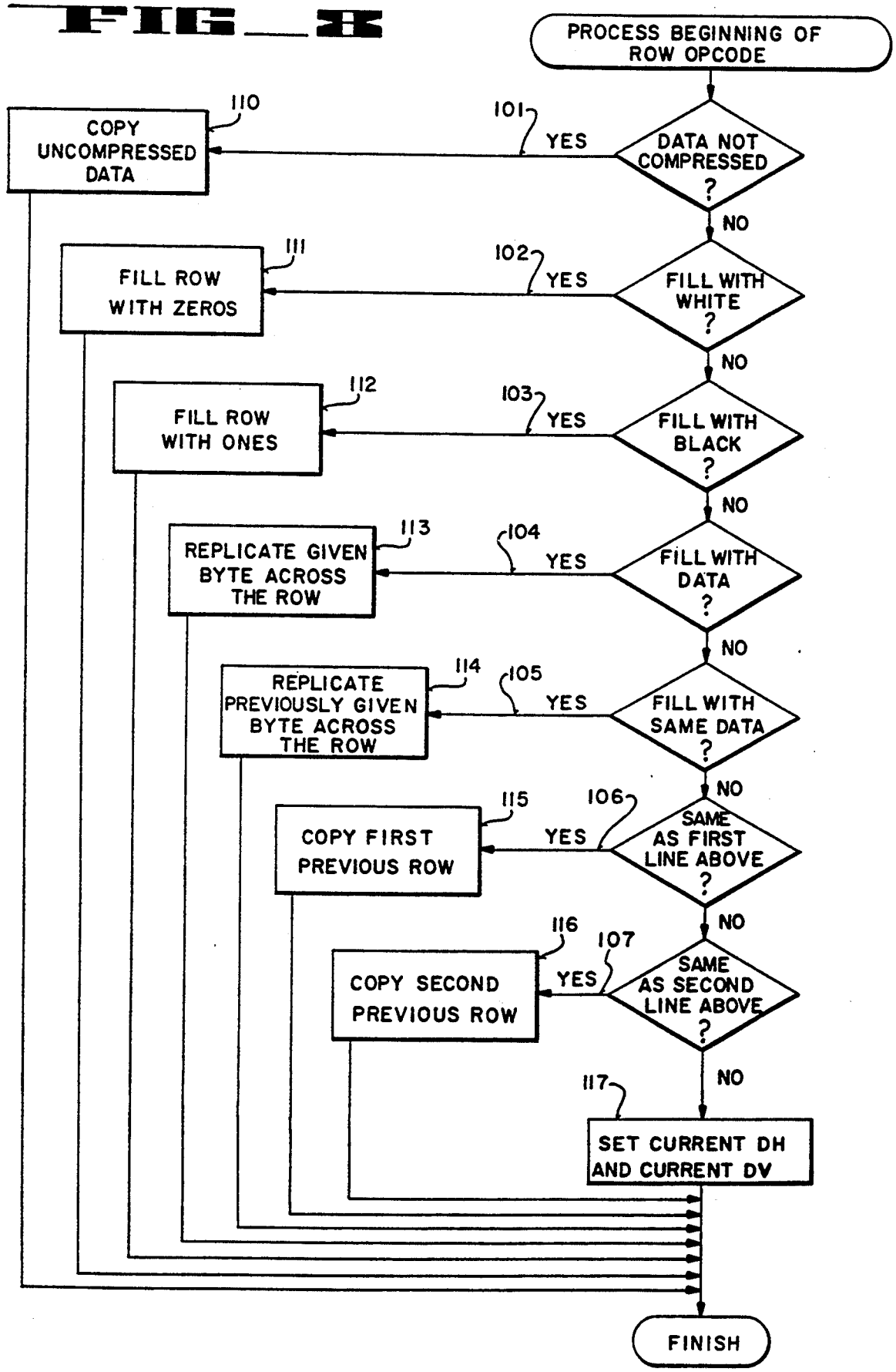

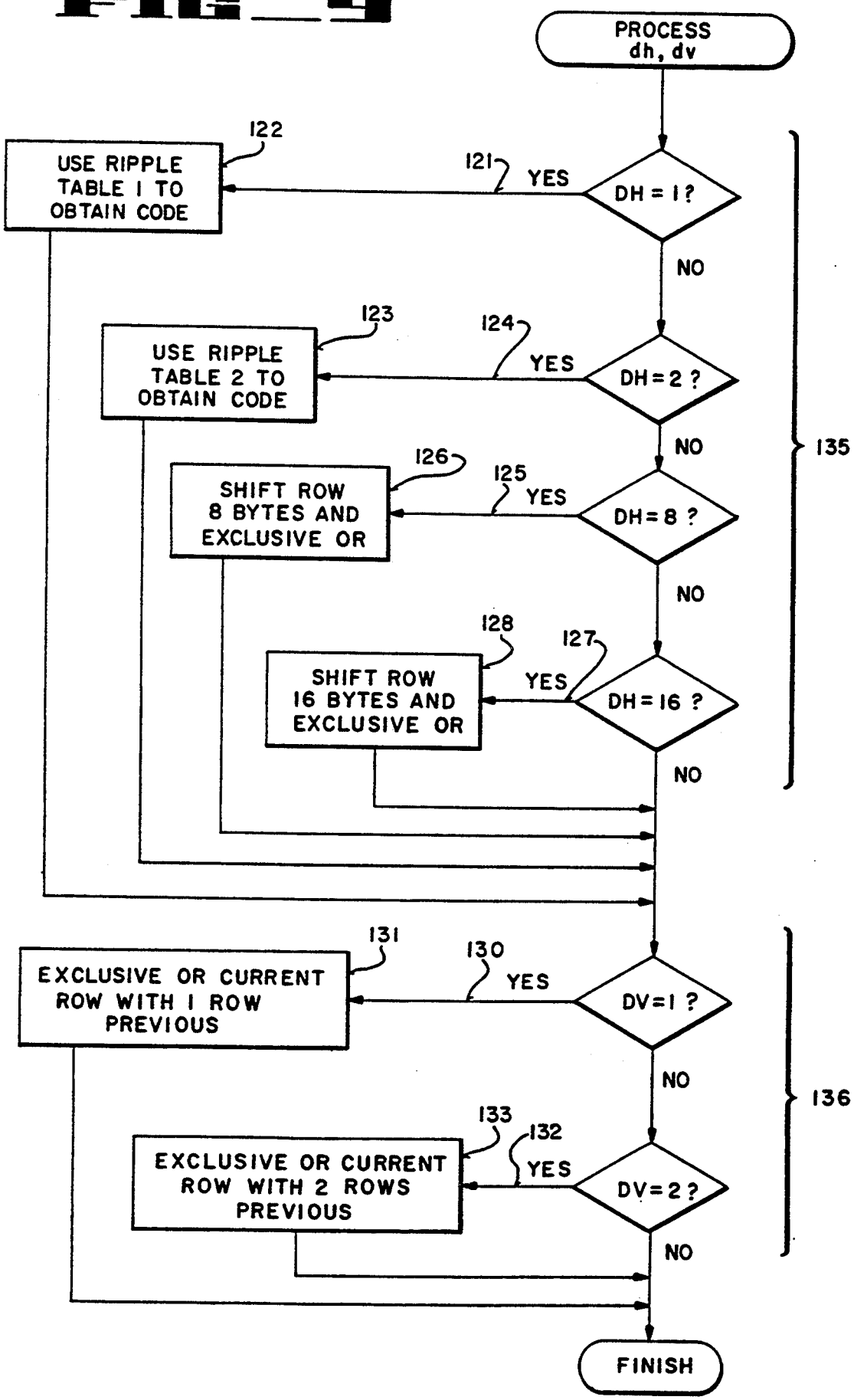

VIDEO COMPRESSION ALGORITHM

This is a continuation of application Ser. No. 07/441,333, filed Nov. 22, 1989 now U.S. Pat. No. 5,033,105, which is a continuation of Ser. No. 07/084,309 filed Aug. 11, 1987 now abandoned.

BACKGROUND OF THE INVENTION

1. Field of the Invention

This invention relates to the field of video compression algorithms and, more specifically, to the field of compression algorithms for bit-mapped graphic displays.

2. Prior Art

Numerous methods are known for compression of data in computer systems and for compression of data for video displays or bit-mapped graphic displays. However, each of these methods suffers from one or more of several disadvantages. A method is desired which allows data to be stored in a compacted form after it is received from a bit-mapped graphics display or other similar device. The data should be stored in a manner which enables it to be decoded with a minimum of resources being used in the decoding process. In addition, the data should be stored in as compact of form as possible.

SUMMARY OF THE INVENTION

A method of compressing video information from a bit-mapped graphics display or similar device is disclosed. The method reduces the number of bits which must be physically stored in order to store a video image. The main steps of the algorithm are enriching a bit-map of the video image in zeros and encoding the enriched image into runs of zeros and data bytes.

The enriching of the video image in zeros is done by performing an auto correlation (shifting and Exclusive ORing) for horizontal and vertical lines. The number of zeros resulting from each correlation is counted until it is determined which combination produces the richest zeros.

The bit-map of zero enriched lines is then encoded into runs of zeros and data bytes. Special cases, such as a row being all zeros or a row being all ones, are recognized and assigned a special code. In addition, special codes are assigned in the case of zero matching the row immediately prior to it or the row two rows prior to it. Special codes are also assigned to indicate that a code is repeated a number of times. Other uses of special codes will be seen in the detailed description of the present invention.

A method of reconstructing the compressed data is also disclosed. This method reads the encoded data and recreates the uncompressed data. Various methods are included for optimizing the speed of this process including the use of a table for decoding certain encoded data.

BRIEF DESCRIPTION OF THE DRAWINGS

FIG. 1 is a flow chart describing steps involved in encoding video data as may be utilized by the present invention.

FIG. 2(a) illustrates a display device with a blackened square in the center as may be compressed by the present invention.

FIG. 2(b) illustrates the blackened square display after a first step of the compression as may be accomplished by the present invention.

FIG. 2(c) illustrates the blackened square display after a second step of compression as may be accomplished by the present invention.

FIG. 3 illustrates an address space of operation codes as may be utilized by the present invention.

FIG. 4(a) illustrates rows of data as may be compressed by the present invention.

FIG. 4(b) illustrates a step of Exclusive ORing to rows of data as may be accomplished by the present invention during compression of the data.

FIG. 4(c) illustrates rows of data and associated compression codes as may be utilized by the present invention.

FIG. 5 is a flow chart illustrating preliminary tests to be performed on rows of data during encoding as may be accomplished by the present invention.

FIG. 6 is a flow chart illustrating a method of determining an optimum zero enriched method as may be utilized by the present invention.

FIG. 7 is a flow chart illustrating a method of reconstructing video data from compressed data as may be utilized by the present invention.

FIG. 8 is a flow chart illustrating a method of processing a beginning of row operation code as may be utilized by the present invention.

FIG. 9 is a flow chart illustrating a process of decoding rows encoded by shifting and Exclusive ORing as may be utilized by the present invention.

DETAILED DESCRIPTION OF THE PRESENT INVENTION

A method of compressing and reconstructing video data is described. In the following description, numerous specific details are set forth such as operation codes, specific steps, etc., in order to provide a thorough understanding of the present invention. It will be obvious, however, to one skilled in the art that the present invention may be practiced without these specific details. In other instances, well known structures and techniques have not been shown in detail in order not to unnecessarily obscure the present invention.

The present invention comprises a method of compressing video information, typically from a bit-mapped display or similar device and a method of reconstructing the compressed video information to allow redisplay of the data. The invention is based on the observation that a typical bit-mapped video image comprises a majority of either "white" areas or patterns of data. A purely random pattern of white and dark areas on a bit-mapped video display is rare.

Therefore, the present invention takes advantage of these observations by further enriching a bit-map of a video image in zeros by performing an auto correlation of vertical and horizontal lines. The enrichment in zeros is due to the large amount of "white space" on the screen before the enrichment process and to the patterns which existed in the video image. The present invention attempts several different correlations, counting the number of zeros produced by each correlation, and utilizes the correlation which produces the richest mixture of zeros. The zero enriched display is then encoded and repetitive encoded combinations are recognized and assigned special codes to further compress the data.

The present invention was disclosed under the Patent and Trademark Office's document disclosure program on Aug. 7, 1986 through submission of computer program code and a statement describing the invention. The disclosure is incorporated here by reference.

Referring now to FIG. 1, a method for compressing data utilized by the preferred of the present invention is disclosed. The method first performs several preliminary tests, block 1, on each row input. These tests will be described in more detail in conjunction with FIG. 5. The tests include testing if a row is all zeros or if the row is all ones, etc. If any of the preliminary conditions are satisfied, branch 2, a code is stored and the next row is accepted as input. If none of the preliminary conditions are satisfied, branch 3, several methods are tried to zero enrich the data, block 4. This will be discussed in more detail in connection with FIG. 6. Next, the zero enriched row is encoded, block 5. A test is then done to determine if the packed data uses less space than the unpacked information. If it doesn't, branch 7, the unpacked information is stored, block 9. If it does, branch 8, the packed information is stored, block 10. The next row of data from the bit-mapped graphics display is then subjected to the same process.

FIG. 2(a) illustrates an example of data which may be stored using the present invention. It will be obvious to one skilled in the art that the present invention is capable of handling any data displayed on a bit-mapped graphics display with varying degrees of effectiveness. FIG. 2(a) illustrates a black rectangle 21 being displayed on a video display. One method of compressing the data on FIG. 2 (a) is to Exclusively OR each row with the row above it.

The result is shown by FIG. 2(b). Using an Exclusive OR process on each row of data on the display yields two lines; line 23 and line 24. Line 23 is in the same row as the top of the rectangle 21 of FIG. 2(a). Line 24 is one row below the bottom of the rectangle 21.

FIG. 2(c) illustrates the result of using a similar Exclusive OR process on the two lines 23 and 24 from FIG. 2(b). Here the Exclusive OR process has occurred on vertical lines across the display, Exclusive ORing each vertical line with the vertical line to its left. The result is four pixels left black 26, 27, 28 and 29. Two of the pixels 26 and 29 are the left most pixels of the rows 23 and 24. The other two pixels 27 and 28, are in the vertical line adjacent to the right most pixels of lines 23 and 24. These FIGS. 2(a), 2(b) and 2(c) are illustrative of the method used by the present invention for zero enriching bit-mapped data. However, it will be seen that the preferred embodiment utilizes several variations on this method to optimize both storage and retrieval of the data.

The preferred embodiment of the present invention utilizes a set of 1-byte (8-bit) codes for compressing the data. These codes are further illustrated in connection with FIG. 3. The codes can be broken down into five major types, normal runs 31, miscellaneous codes 32, repeat codes 33, big data 34, and big zero 35. The normal run codes 31 utilize hexadecimal values 00-7F. The format of a normal run code in the preferred embodiment of the present invention is 0dddzzzz, where ddd is a count of data bytes which follow this code byte and zzzz is a count of zeros between 0 and 15. For example, a string of data consisting of eight zeros followed by 2 bytes of data, one being represented by hexadecimal FF or all black and the second byte being represented by AA or being gray may be encoded as hexadecimal 28 FF AA. Thus, four bytes of data have been compressed to three bytes of data.

A number of miscellaneous codes are utilized by the present invention for storing information about rows which have met the preliminary conditions discussed in conjunction with FIG. 1 and FIG. 5 and for storing information regarding which method yielded the optimum zero enriched row of data. The preferred embodiment of the present invention utilizes hexadecimal values 80-9F as indicated below for miscellaneous codes.

| MISCELLANEOUS CODES | |
|---|---|
| CODE | DESCRIPTION |
| $80 | COULD NOT PACK |
| $81 | ROW ALL ZEROS |
| $82 | ROW ALL ONES |
| $83 | FILL DATA |
| $84 | FILL SAME DATA |
| $85 | DUPLICATE 1 LINE ABOVE |
| $86 | DUPLICATE 2 LINES ABOVE |
| $87 | UNUSED |
| $88 | dh, dv = 16, 0 |
| $89 | dh, dv = 0, 0 |
| $8A | dh, dv = 0, 1 |
| $8B | dh, dv = 0, 2 |
| $8C | dh, dv = 1, 0 |
| $8D | dh, dv = 1, 1 |
| $8E | dh, dv = 2, 2 |
| $8F | dh, dv = 8, 0 |
| $90–9F | UNUSED |

Hexadecimal code 80 indicates that data could not be packed without using more space than the original data. The unpacked data follows the code. Hexadecimal code 81 indicates the row consisted of all zeros. Hexadecimal code 82 indicates the row consisted of all ones. Hexadecimal code 83 indicates the row consisted of bytes of data which repeated. In this case, the code is followed with a single byte of data indicating the byte of data which repeats. Hexadecimal 84 indicates this row repeats the same byte of data that was repeated in the previous row. Hexadecimal code 85 indicates this row is a duplicate of the row immediately above it. Hexadecimal 86 indicates this row is a duplicate of the row two rows above it. Hexadecimal 87 is currently not used in the preferred embodiment. Hexadecimal 88 through 8F indicate which of various horizontal deltas (dh) and vertical deltas (dv) were utilized to yield the optimum zero enriched row. In the preferred embodiment, hexadecimal codes 90 through 9F are currently not used.

Each of these miscellaneous codes 80 through 9F are utilized only when analyzing a row at the beginning of the row. Therefore, these codes are unused when storing data within a row and may be utilized for future expansion within a row.

Codes A0 through BF indicate the previous one byte operation code repeats zero to thirty-one times. The format for these codes is 101nnnnn$_2$ where nnnnn is a value between $0_{10}$ and $31_{10}$. For example, if the previous op code was 81 and a repeat code of A6 is detected, six white lines will be displayed as a result.

Codes C0 through DF indicate a string of data bytes follows. The format of these codes, in binary, is 111ddddd, where ddddd is a count of data bytes which follow divided by 8. For example, if a string of sixteen data bytes is to be represented, a code of hexadecimal C2 (16−8=2) is stored followed by the sixteen data bytes.

Codes E0 through FF indicate a string of zeros exist in the data. The format of this code is 111zzzzz, where zzzzz is a count of zeros divided by 16. For example, if a string of 160 zeros was found in a row of data a code of hexadecimal CA ($160-16=10_{10}$ or $A_{16}$) is stored.

FIGS. 4(a) through 4(c) are illustrative of this method of encoding data. In FIG. 4(a) a set of rows of data as may be compressed by the present invention is shown. The data consists of a row of all zeros 41 followed by four rows 42 which would display as a blackened rectangle and another row of all zeros 43. The first row 41 may be represented with the code 81 for a row consisting of all zeros. Row 2 may be shifted 1-bit to the right and exclusive OR'd with itself. This is shown in FIG. 4(b). Row 2 44 is Exclusive OR'd with a copy of itself shifted 1-bit to the right, row 45, yielding a result 46. This row is optimized in zeros. An operation code 8C is stored by the preferred embodiment of the present invention to indicate a delta of shifting horizontally right 1-bit and vertically 0-bits when performing the Exclusive OR process. Rows 3, 4, and 5 may be represented by code 85 indicating they are duplicates of the lines immediately above them. Row 6 may be represented by code 81 indicating it is all zeros. FIG. 4(c) illustrates rows 1-6 and the resulting codes 50.

Referring to FIG. 5, a flow chart illustrating the preliminary tests performed by the preferred embodiment of the present invention when compressing data is shown. A row is first tested to determine if it is all white or zeros and, if it is, branch 55 is taken and the code indicating it is all white is recorded.

Next, a test is performed to determine if the row is all black or ones and, if it is, branch 56 is taken and a code indicating it is all black is recorded.

Next, a test is done to determine if the row repeats the same byte of data across the entire row. If it does, branch 57 is taken. If branch 57 is taken, a test is done to see if the row repeats the same byte repeated by the previous row and, if so, branch 54 is taken and a code is stored indicating it repeats the same code. Otherwise a code is stored indicating it repeats a byte and that byte is stored.

Next, a check is done to determine if the row matches the row previous to it and, if so, branch 58 is taken and a code is stored indicating the row is a duplicate of the row above it.

Next, a test is done to determine if the row matches the row two rows previous to it and, if it does, branch 59 is taken and a code is stored indicating the row matches the row two lines previous to it.

As previously discussed in connection with FIG. 1, if none of these preliminary conditions are satisfied a determination is made which of several methods of shifting and Exclusive ORing rows of data will produce a row which is optimized in zeros. Referring now to FIG. 6, a flow chart for a process for determining an optimum zero enriched method as utilized by the preferred embodiment of the present invention is shown. This method consists of first initializing several variables including setting a variable, called bestcount, to the number of non-zero words in the current row, block 60. A determination is then made of nonequal words between the current row and the immediately previous row, block 61. If this count of nonequal words is less than bestcount branch 62 is taken and zero is stored as the best horizontal delta, one is stored as the best vertical delta and the count is stored as bestcount. In other words, should this be the optimum method, the Exclusive OR process will be done using the row immediately preceding the current row and the current row as inputs without shifting the current row to the right. A check is then done to see if bestcount is less than a threshold value, the threshold value being computed as 2 plus the word count of the row buffer divided by 8. If bestcount is less than the threshold value, it is assumed that this is the optimum method for zero enriching this row of data. Otherwise, branch 75 is taken.

If either 63 or branch 75 is taken, the next step is to determine the count of nonequal words between the current row and the row two rows previous, block 64. If this count is less than bestcount, branch 65 is taken and 0 is stored as bestdh and 2 is stored as bestdv. The count is then stored as bestcount, block 76. If bestcount is less than the threshold value, branch 77 is taken and it is assumed that the optimum zero enriched method is using the row two rows above the current row and the current row as inputs to an Exclusive OR. Otherwise, branch 78 is taken.

If branch 66 or branch 78 is taken, a loop is performed to determine which of several vertical and horizontal delta combinations will yield the optimum zero enriched method. In the preferred embodiment of the present invention these combinations include a horizontal delta of 1 with a vertical delta of 0, in other words shifting the current row to the right one bit and using the shifted row and the current row as inputs to an Exclusive OR, a horizontal delta of 1 and a vertical delta of 1, a horizontal delta of 2 and a vertical delta of 2, a horizontal delta of 8 and a vertical delta of 0 and a horizontal delta of 16 and a vertical of 0. For each of these combinations a count of non-zero words is determined, block 67. If this count is less than bestcount, branch 69, that combination is stored as the bestdh and bestdv. If the count is not less than bestcount, branch 70 the next dh, dv combination is attempted, branch 71. If there are no more dh, dv combinations it is assumed that the currently stored bestdh and bestdv are the optimum for zero enriching this row.

FIG. 7 is a flow chart showing a process used for decoding the compressed video information as may be utilized by the present invention. First, several variables are initialized, block 81. This includes initializing a variable named repeatcount to 0. Next a loop is entered which is executed for each code stored for the video image. The first step is to determine if count repeat is greater than 0 and if it is, branch 82 the operation code is set to the previous operation code, i.e., the operation code is repeated and repeatcount is decremented, block 84. If repeatcount is equal to 0, branch 83, the next operation code is read, block 85. A check is then made to determine if this operation code indicates the beginning of a row of data. If it does not, branch 86, the row information is unpacked, block 88.

If the code indicates this is the beginning of a row, branch 87 is taken. A test is done to determine if the operation code is a repeat operation code. If it is, branch 89, the repeatcount is set to the repeatcount of the repeat operation code and the next operation code is stored as the operation code to be repeated, block 91.

If the operation code does not equal the repeat operation code, branch 90 is taken and the processing of a beginning of row operation code is done, block 92. The processing of a beginning of row operation code will be more fully explained in conjunction with FIGS. 8 and 9. The data is then put into a buffer, block 93. A test is done to determine whether there are more operation codes to process. If there are, branch 94 is taken. Otherwise, branch 95 is taken.

The processing of a beginning of row operation code as performed by the preferred embodiment of the present invention, is shown in FIG. 8. The first step in processing a beginning of row operation code is to test for a code that indicates the data is not compressed. If the data is not compressed, branch 101, the uncompressed data is copied into a buffer, block 110.

If the data is compressed, a test is done to determine if the operation code indicates the row should be filled with zeros (i.e., the row is white). If the row is to be filled with zeros, branch 102, an operation is done to fill the row with zeros, block 111. Otherwise, a test is done to determine if the row should be filled with ones (i.e., the row is black). If so, branch 103 is taken and the row is filled with ones, block 112.

Otherwise, a check is done to determine if the code indicates a byte of data is repeated across the row. If so, branch 104 is taken and the given byte of data is read and duplicated across the row, block 113. Next, a test is done to determine if the operation code indicates the byte of data repeated across the previous row should be repeated across this row. If so, branch 105 is taken and the byte of data is replicated across the row, block 114.

Otherwise, a test is done to determine if the current row is a duplicate of the row immediately above it and if so, branch 106 is taken. A copy of the immediately previous row is then made, block 115. Finally, a test is done to determine if the code indicates the row is an exact duplicate of the second row above it and, if so, branch 107 is taken. In this case the second row above the current row is copied, block 116.

If all of the above tests fail, a series of tests are performed to determine what horizontal delta and vertical delta should be used in the shifting and Exclusive ORing process for this row, block 117.

After the current horizontal delta and the current vertical delta are set, the shifting and Exclusive ORing process is executed. The first step is to determine the appropriate horizontal delta for the row of data and shift a copy of the row the delta number of bytes to the left. An Exclusive OR process is then performed using the shifted copy of the row and the original current row of data as inputs. Next, tests are done to determine whether the resulting row should be Exclusive OR'd with either the immediately previous row or the row two rows previous.

Referring now to FIG. 9, the preferred embodiment of the present invention first checks to see if the horizontal delta for the current row is a 1. If so branch 121 is taken. A table is used by the preferred embodiment of the present invention, to translate the stored row of data into the row of data to be displayed. Use of the table increases the speed of processing the data. The table consists of the translated values for each possible encoded value. For example, in the table at a relative offset of $14_{10}$ a value $11_{10}$ appears. This is because the value $11_{10}$ ($1011_2$) shifted right one position ($0101_2$) used as input to an Exclusive OR function with the other input being $11_{10}$ yields as a result $14_{10}$ ($1011_2$ XOR $1010_2 = 1110_2$). Therefore, the encoded row will have a $14_{10}$ translated back to an $11_{10}$ using this table. The table contains similar translation values at the appropriate offset addresses for other input values.

If the horizontal delta is a 2, branch 124 is taken and a similar table is used to obtain the translated codes, block 123. If the horizontal delta is equal to 8, branch 125 is taken and the row is shifted 8 bytes and subjected to an Exclusive OR process to obtain the original data.

Finally, if the horizontal delta is equal to 16, branch 127 is taken and the row is shifted 16 bytes and subjected to an Exclusive OR process, block 128.

After processing the horizontal deltas a check is done to determine whether the vertical delta is equal to a one. If so, branch 130 is used. The current row and the row immediately previous are used as inputs to an Exclusive OR process to obtain the original value for the current row, block 131. Otherwise, a check is done to determine if the vertical delta is equal to a 2. If so, branch 132 is taken and the current row is Exclusive OR'd with two rows previous, the result being the original value for this row, block 133.

Thus, a method for compressing and decoding video data from a bit-mapped graphics display is disclosed.

I claim:

1. A method of compressing information comprising the steps of:
   (a) enriching a bit-map of said information in a first binary state by:
      (i) copying a first row of said bit-map;
      (ii) shifting said copy of said first row a predetermined number of bits in a first direction;
      (iii) performing a logical operation using as input said first row of data and said copy of said first row of data yielding a second row of data;
      (iv) determining the number of bits of data in said second row of data which are in said first binary state;
      (v) if said number of bits in said binary state is greater than a first value, storing said number of bits as said first value and storing said predetermined number as a second value; and
   (b) encoding said enriched bit-map.

2. The method, as recited by claim 1, wherein said encoding of said enriched bit-map comprises the steps of:
   determining whether a first row of said bit-map meets one of a predetermined set of conditions;
   if one of said predetermined set of conditions is met, storing one of a first set of predetermined codes.

3. The method, as recited by claim 2, wherein said predetermined set of conditions comprises:
   determining if said first row is all in said first binary state;
   determining if said first row is all in a second binary state;
   determining if a first group of bits repeats in said first row; and
   determining if said first row is identical to a second row of said bit-map.

4. The method, as recited by claim 1, further comprising the step of decoding said encoded information.

5. The method, as recited by claim 4, wherein said decoding of said encoded information comprises the steps of:
   (a) reading an operation code;
   (b) determining from said operation code whether the operation code indicates the beginning of a first row of data;
   (c) if said operation code indicates the beginning of said first row of data, processing said operation code;
   (d) otherwise, unpacking said first row of data.

6. The method, as recited in claim 5, wherein said processing a beginning of row operation code comprises the steps of:

(a) if said operation code indicates the data is not compressed, copying the uncompressed data;

(b) if said operation code indicates said first row is comprised of bits all of a first binary state, filling said first row with bits of said first binary state;

(c) if said operation code indicates said first row is comprised of bits all of a second binary state, filling said first row with bits of said second binary state;

(d) if said operation code indicates the data repeats a block of data, filling said first row with duplicates of said block of data;

(e) if said operation code indicates said first row is the same as a second row offset a predetermined number of rows from said first row, copying said second row.

7. The method, as recited in claim 6, wherein said unpacking of said data comprises the step of using a table having predetermined values to unpack said data.

8. The method, as recited by claim 1, wherein said encoding said enriched bit-map comprises the step of representing said enriched bit-map with codes representing runs of bits in said first binary state and runs of bits in a second binary state.

9. The method, as recited by claim 1, wherein said first binary state is a low state.

10. The method as recited by claim 1 wherein steps (i) through (v) are repeated for each of a first set of predetermined numbers.

11. The method as recited by claim 1 wherein said logical function is an Exclusive OR function.

12. A method of compressing and redisplaying video information from a bit-mapped display device comprising the steps of:

determining whether one of a first set of predetermined conditions is satisfied by a first row of data;

if one of said first set of predetermined conditions is satisfied storing one of a first set of codes;

enriching said bit-map of said information in a first binary state by shifting a copy of said bit map and performing an Exclusive OR function using said bit map and said shifted copy of said bit map as inputs to said Exclusive OR function;

encoding said enriched bit-map by representing said bit-map as runs of said first binary state and runs of a second binary state;

decoding said information by reading a plurality of operations codes and reconstructing said bit-map from said operation codes.

13. The method, as recited by claim 12, wherein said first set of predetermined conditions comprises:

determining if all bits in said first row of said information are in said first binary state;

determining if all bits of said first row of said information are in said second binary state;

determining if a first group of bits repeats in said first row; and determining if said first row is identical to a second row of said bit-map.

14. The method, as recited by claim 13, wherein said first binary state is a low state.

15. The method, as recited by claim 14, wherein said second binary state is a high state.

16. The method, as recited by claim 12, wherein said unpacking of said data comprises the step of using a translation table having predetermined values to unpack said data.

* * * * *